(12) United States Patent
Ueda

(10) Patent No.: US 7,242,093 B2
(45) Date of Patent: Jul. 10, 2007

(54) SEMICONDUCTOR DEVICE

(75) Inventor: Yoshitaka Ueda, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/627,608

(22) Filed: Jul. 28, 2003

(65) Prior Publication Data
US 2004/0017008 A1    Jan. 29, 2004

(30) Foreign Application Priority Data
Jul. 29, 2002    (JP) .............. 2002-219834

(51) Int. Cl.
*H01L 23/48* (2006.01)
(52) U.S. Cl. ................... 257/737
(58) Field of Classification Search ........ 257/734–739, 257/678–692
See application file for complete search history.

(56) References Cited

U.S. PATENT DOCUMENTS

| | | | |
|---|---|---|---|
| 6,265,783 B1* | 7/2001 | Juso et al. ............ | 257/786 |
| 6,303,996 B2* | 10/2001 | Lin ..................... | 257/777 |
| 6,500,764 B1* | 12/2002 | Pritchett ............. | 438/690 |
| 6,590,291 B2* | 7/2003 | Akagawa ............. | 257/774 |
| 6,600,221 B2* | 7/2003 | Kimura ............... | 257/686 |
| 6,674,162 B2* | 1/2004 | Takao ................. | 257/700 |
| 6,720,644 B2* | 4/2004 | Yoshizawa et al. ... | 257/692 |
| 2002/0084522 A1* | 7/2002 | Yoshizawa et al. ... | 257/692 |
| 2003/0085469 A1* | 5/2003 | Yamada et al. ...... | 257/773 |
| 2003/0218246 A1* | 11/2003 | Abe et al. ........... | 257/734 |
| 2003/0230799 A1* | 12/2003 | Yee et al. ............ | 257/706 |
| 2004/0026781 A1* | 2/2004 | Nakai ................. | 257/737 |
| 2004/0169287 A1* | 9/2004 | Honda ................ | 257/778 |

FOREIGN PATENT DOCUMENTS

JP    1-199651    9/1986

(Continued)

OTHER PUBLICATIONS

K. Kawamata et al., "Measurement of Voltage and Current Transition Durations Due to Very Short Gap Discharge in Air Using Distributed Constant Line System," Tech Research Report of the Institute of Electronics, Information & Communication Engineers, 1998, pp. 37-42.

*Primary Examiner*—Nathan W. Ha
(74) *Attorney, Agent, or Firm*—Foley & Lardner LLP

(57) ABSTRACT

The present invention provides a large scale integrated circuit which is capable of coping with the problems associated with the situation in which the number of pins used in the circuit is increased, and is capable, even when dummy bumps (DBPs) are installed, of suppressing storage of an excessive charge to the DBPs and prevent discharge to adjacent bump electrodes and prevent breakdown of a semiconductor chip due to electrostatic noise. On the element formation face of the semiconductor chip wherepads (PDs) are formed, a layer insulating film for rewiring, external bumps (EBPs) that correspond respectively to PDs formed on the layer insulating film, dummy bumps (DBPs) lacking corresponding PDs on the semiconductor chip, external bump rewirings that connect the PDs and the corresponding EBPs, and dummy bump rewirings that connect DBPs and prescribed EBPs are formed in addition. An electrostatic protection means is installed between a PD connected to an EBP that is connected to a DBP and an internal circuit section or an I/O circuit section of the semiconductor chip.

14 Claims, 12 Drawing Sheets

FOREIGN PATENT DOCUMENTS

| | | |
|---|---|---|
| JP | 1-238148 | 9/1989 |
| JP | 2-119171 | 5/1990 |
| JP | 10-012620 | 1/1998 |
| JP | 11-163247 | 6/1999 |
| JP | 11-233777 | 8/1999 |
| JP | 2001-348305 | 12/2001 |

* cited by examiner

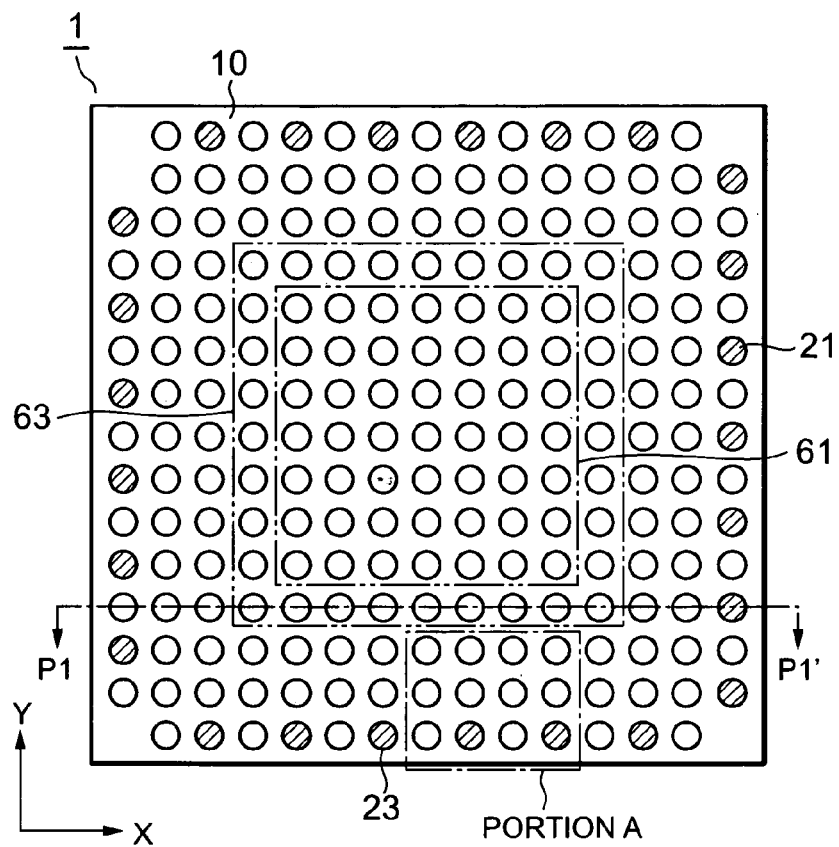
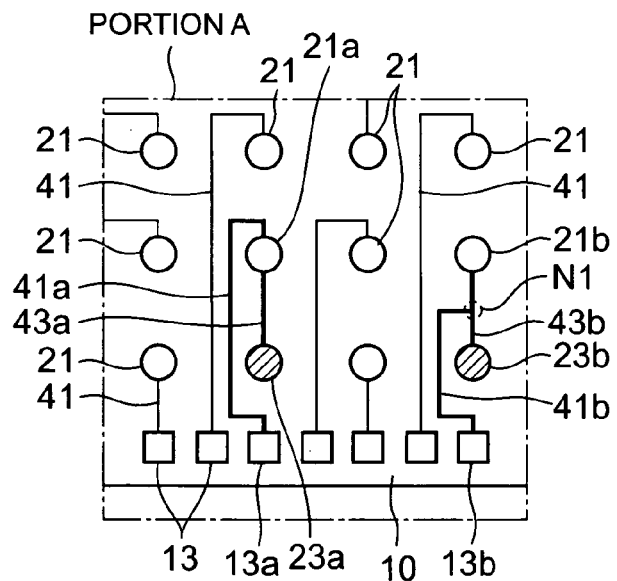
| 1 LSI | 41 EB REWIRING |
| 10 CHIP | 43 DB REWIRING |
| 13 PD | 61 FIRST BOUNDARY |
| 21 EBP | 63 SECOND BOUNDARY |
| 23 DBP | |

11 FIRST INSULATING FILM
15 LAYER INSULATING FILM FOR REWIRING
17 SECOND INSULATING FILM

80 INTERNAL CIRCUIT SECTION
82 I / O BUFFER CELL
83 I / O CIRCUIT SECTION
85 PERIPHERAL REGION
88 ELECTROSTATIC PROTECTION CIRCUIT

100 MOUNTING SUBSTRATE
121,123 SUBSTRATE ELECTRODE
135 LEAD-OUT WIRING

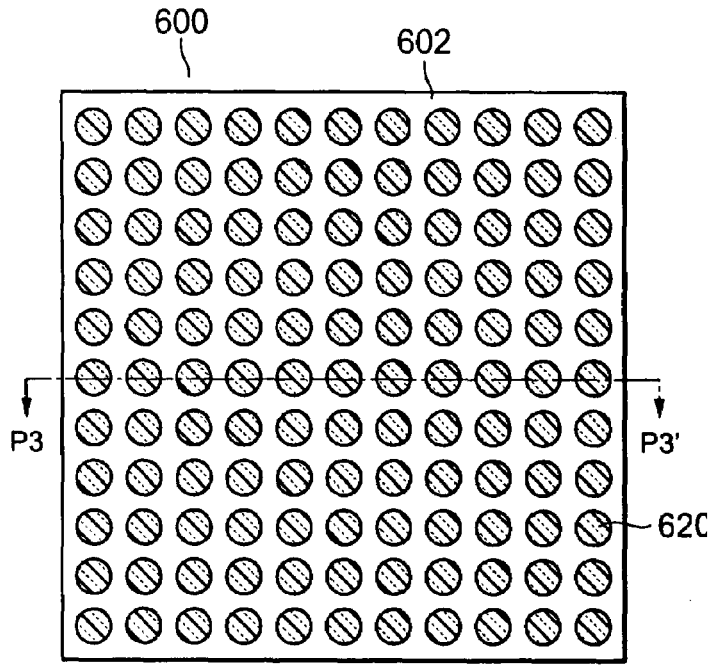
FIG.9 (a) PRIOR ART
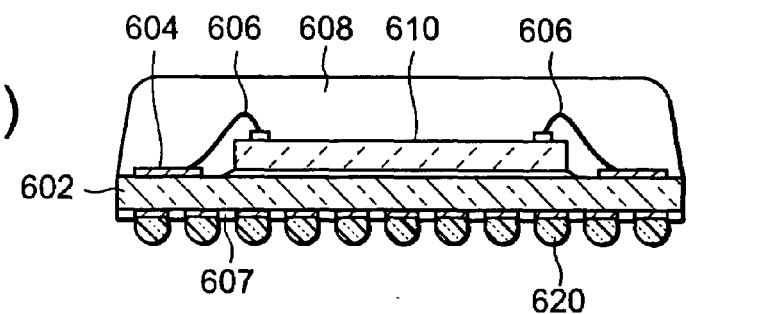
FIG.9 (b) PRIOR ART
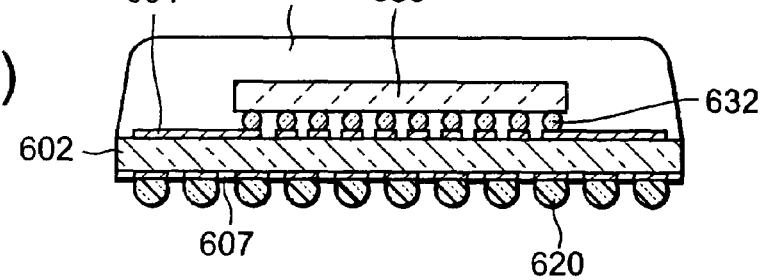
FIG.9 (c) PRIOR ART
600 BGA TYPE LSI
602 PRINTED BOARD
604 BOARD WIRING
606 METAL WIRE
607 INSULATING FILM
608 SEALING RESIN
610, 630 CHIP
620 FIRST BUMP ELECTRODE
632 SECOND BUMP ELECTRODE

SEMICONDUCTOR DEVICE

BACKGROUND OF THE INVENTION

1. Field of the Invention

The present invention relates to a semiconductor device which uses bumps formed of solder balls or the like as external connection terminals, and more particularly to a semiconductor device that is enhanced in the breakdown voltage to electrostatic noise.

2. Description of the Prior Art

In the semiconductor devices (referred to as LSIs hereinafter) of recent years, the increase in the number of pins used is remarkable along with the achieved high level of integration and scale, as a result of advancement in the micro processing technology. As the methods of making the increase in the number of pins and miniaturization of the LSIs compatible, flip chip type LSIs (referred to as FCLSIs hereinafter), CSP (chip size package/chip scale package) type LSIs, and the like, in which bumps for external connection are formed two-dimensionally on the main face side where semiconductor chip elements are formed via an insulating resin layer, an interposer, or the like, have been developed. In addition, as another method for making the increasing pin number and the miniaturization compathatible, there have been developed the ball grid array (BGA) type LSIs. In this method, a semiconductor chip is mounted on the face opposite to the bump formation face of a printed board where bumps of solder ball or the like are arranged two-dimensionally, then after bonding a wiring conductor of the printed board connected to each bump to an electrode on the semiconductor chip with a wire of metal such as gold (Au), or solder connecting the electrode on the semiconductor chip with a bump formed thereon to the wiring conductor on the printed board, the semiconductor chip on the printed board and bonding wires and the like are sealed with a resin.

In FIG. 7 which shows an example of the conventional FCLSIs, part (a) is a plan view showing schematically the arrangement state of ball bumps on the face on which ball bumps are formed, and part (b) is an enlarged plan view of the portion including the connection wirings between the ball bumps and the electrodes on the chip in part C of part (a), and FIG. 8 is a sectional view along line P2–P2' in part (a). Referring to FIG. 7 and FIG. 8, it can be seen that a conventional FCLSI 500 is provided with external connection bumps 521 and 523 formed two-dimensionally, via an insulating resin layer 515, on its main face where elements of a semiconductor chip 510 are formed, and rewiring conductors 541 which connect respective bumps 521 and 523 to respective electrodes 513 of the semiconductor chip 510.

Moreover, in FIG. 9 which shows an example of the conventional BGA type LSIs, (a) is a plan view of the back face where ball bumps are formed, and (b) and (c) are sectional views along line P3–P3' of (a), showing the cases in which the electrodes of the semiconductor chip and the wiring conductors on the printed board are connected by bondings of metal wire and by bumps, respectively. Referring to FIG. 9, a conventional BGA type LSI 600 has a semiconductor chip 610 or 630 mounted on one main face of a printed board 602, first bump electrodes 620 of solder or the like formed at openings of an insulating film 607 formed on the face opposite to the one main face of the printed board 602, board wirings 604 and the chip 610 or 630 are connected either by bondings of metal wire 606 or by second bump electrodes 632 formed on the chip 630, and the semiconductor chip 610 and the metal wires 606 or the semiconductor chip 630 and the second bump electrodes 632 formed thereon are covered with a sealing resin 608.

In the FCLSI, CSP type LSI, BGA type LSI, and the like, the problems related to the increasing pin number and the miniaturization of the LSI are simultaneously taken care of by arranging the bumps that serve as external connection electrodes in two dimensions. In connection with these LSIs, installment of dummy bumps (referred to as DBPs hereinafter) is disclosed in, for example, Japanese Patent Applications Laid Open, No. Hei 1-238148 (referred to as well-known example 1 hereinafter) and Japanese Patent Applications Laid Open, No. Hei 10-12620 (referred to as well-known example 2 hereinafter) in order to increase the connection strength at mounting on the mount substrate as well as to enhance the connection reliability by securing parallel holding of the LSI and the mount substrate through uniformization of bump arrangement within the bump formation plane of the LSI, although it is not necessarily indispensable for realization of the functions of the LSIs.

In FIG. 10 for describing the semiconductor chip disclosed in well-known example 1, (a) and (b) are a plan view showing the arrangement of the bump electrodes and a sectional view of an important part of the chip, respectively, and (c) and (d) are schematic sectional views showing sequentially the mounting processes as seen at a position corresponding to line P4–P4' in (a), respectively. Referring to FIG. 10, a semiconductor chip 701 disclosed in the well-known example 1 has, in its central section, bump electrodes 702 for connecting circuit elements in the chip to wiring conductors of a support substrate 709 to be mounted, and has DBPs 703 provided, at nearly a constant interval, in the periphery of the chip 701 surrounding the bump electrodes 702. The bump electrodes 702 and the DBPs 703 are formed in a manner stated roughly as in the following. On a first wiring conductor 731 which makes contact with an element region 711 of the chip 701 at an opening of an oxide film 721, a second wiring conductor 732 is formed via a layer insulating film 722, making contact with the first wiring conductor 731 at an opening in the layer insulating film 722. A passivation film 708 is formed to cover the top faces of the second wiring conductor 732 and the layer insulating film 722, and openings are formed on the second wiring conductor 732 and near the outer periphery of the chip 701 by photoetching. Then, after formation of an underlying metal layer 707 by laminating a chromium (Cr), a copper (Cu) and a gold (Au) films, the layer is patterned by photoetching, solder spots are attached onto the underlying metal layer 707 by solder plating, and solder spots are made spherical by heating to about 350° C., forming bump electrodes 702 and somewhat larger DBPs 703. At mounting of the chip 701, the bump formation face of the chip 701 is placed on the wiring support substrate 709, opposing the surface of the substrate 709. In this case, a thickness supplementing solder layers 710 are attached on the substrate in advance to compensate for the height difference between the DBPs 703 and the bump electrodes 702. When the system is subjected to solder reflow thereafter, the bump electrodes 702 with small diameter melt first to be adhered to the supplementary solder layers 710 during which time the bump electrodes 702 are formed into solder posts with height equal to the distance between the chip and the substrate that is kept constant by the DBPs with largediameter. After lapse of a certain time, the DBPs 703 start to melt and the peripheral part of the chip 701 and the substrate 709 are bonded. Following that, the DBPs 703 are fixed to the substrate 709 by covering their surroundings with, for example, an epoxy resin 704.

FIG. 11 is the plan view showing an example of configuration of bump electrodes of an FCLSI disclosed in the well-known example 2. The bump electrodes of the FCLSI 750 consist of a main bump electrode line 752a which is connected to the elements within the chip and a dummy auxiliary bump electrode line 752b which is not connected to the elements within the chip, and these are arranged along the periphery of the chip with the auxiliary bump electrode line 752b on the outer peripheral side. Moreover, the diameter of the bump electrodes in the auxiliary bump electrode line 752b is made larger than the diameter of the bump electrodes in the main bump electrode line 752a in order to facilitate filling of the resin between the chip and the substrate through increase in the amount of solder per chip and to enhance the bonding life of bump electrodes that are further away from the center of the chip.

However, it became clear with the configuration of the semiconductor chip as disclosed in well-known examples 1 and 2 that when electrostatic noise is applied to the DBPs, there arises a problem in that discharge is caused between the neighboring bump electrodes, and the internal elements connected to the bump electrodes are damaged or broken down.

More specifically, when there exist externally connected electrodes, like the DBPs in this case, that are not connected to any of the elements within the semiconductor chip, and electrostatic noise is applied to the DBPs, it results in a gap discharge phenomenon due to absence of discharge route for the charge. Moreover, since the voltage in the gap discharge phenomenon is higher in the case of an FCLSI, CSP type LSI, BGA type LSI, or the like where the bump electrode space (pin space) is larger than that in the case of a supermultiple-pin quad flat package (QFP) or the like where the pin space is smaller, damages to the adjacent bump electrodes are more conspicuous accordingly.

For example, in the chip 701 of the well-known example 1, the bump electrodes 702 adjacent to the DBPs 703 are connected to an electrostatic discharge protection circuit (not shown) formed on the semiconductor chip 701 via the first wiring conductor 731 and the second wiring conductor 732. Since, however, the electrostatic noise due to the gap discharge phenomenon is a pulse steeper than the breakdown voltage of the electrostatic discharge protection circuit, there is a possibility that it breaks down the semiconductor chip.

The gap discharge phenomenon is described in detail in, for example, Technical Research Report of the Institute of Electronics, Information and Communication Engineers (Environmental Electromagnetic Engineering), Dec. 18, 1998, pp. 37–42. According to the paper, the discharge is a very steep pulse with the current rise time of less than ins for voltages below 3,000V. On the other hand, according to the ESDA specifications, the JEDEC specifications, or the like used as the reference for the breakdown voltage in the design of normal LSI devices, the rise time of the discharge waveform is defined to be about 2–10 ns. The problem mentioned above is brought about because this value is gentle compared with the rise time of the discharge waveform in the gap discharge.

As the methods of resolving such a problem, a method of, for example, providing an electrostatic discharge protection circuit exclusively for external connection electrodes not connected to any of the elements within the semiconductor chip, namely, exclusively for non-connected (NC) pins, is disclosed in Japanese Patent Applications Laid Open, No. Hei 11-163247 (referred to as well-known example 3 hereinafter), although it is intended for dealing with a lead frame such as a QFP. In addition, a method of connecting dummy pins being NC pins to an adjacent input terminal via a resistor is disclosed in Japanese Patent Applications Laid Open No. Hei 11-233777 (referred to as well-known example 4 hereinafter).

FIG. 12 is an explanatory drawing of NC pins and the electrostatic discharge protection circuit disclosed in the well-known example 3. Referring to FIG. 12, there is shown a semiconductor device in which a bonding pad 812 and an electrostatic discharge protection circuit 814 dedicated to an NC pin are formed on a semiconductor chip 810, and an NC pin P1 (inner lead 803) and the bonding pad 812 dedicated to the NC pin are connected by a bonding wire 807. In this case, a method of preventing breakdown of the semiconductor chip due to electrostatic discharge to the input pins P3 adjacent to the NC pin P1 is disclosed by absorbing the overvoltage of the electrostatic noise applied to the NC pin P1 by the electrostatic discharge protection circuit 814 dedicated to the NC pin, and discharging (through surge path SGP) the charge to a power supply (Vcc, for example) line.

This method is effective in the point that the breakdown of the semiconductor chip 810 due to electrostatic discharge to the input pins P3 adjacent to the NC pin P1 is prevented by discharging the electrostatic noise applied to the NC pin P1 to the power supply line.

However, since the bonding pad 812 and the electrostatic discharge protection circuit 814 dedicated to the NC pin are formed in this method, the chip size becomes large as the number of the NC pins increases and the number of effective chips per semiconductor wafer decreases, so that it gives rise to the problem of increase in the production cost.

Moreover, in the well-known example 4, a method is disclosed in which the dummy terminal is connected to an adjacent input terminal via a resistor section, and a large quantity of static electricity generated in the dummy terminal is attenuated by the resistor section and the result is made to be absorbed by a protective circuit connected to the input terminal, or when a larger quantity of static electricity is generated, the protective circuit or internal TFT elements that are connected to the input terminals are protected by disconnecting the resistor section. However, it is also necessary in this method to provide a resistor for each NC pin which requires the chip size to be increased, so that similar to the well-known example 3, the number of effective chips per semiconductor wafer, leading to the problem of increase in the production cost.

Moreover, the problem relating to the electrostatic noise will not arise if the DBPs of the semiconductor device in the well-known examples 1 and 2 are connected to a power supply wiring such as the ground potential. However, it will result in a problem that the lead-out of the wiring conductors connected to the bump electrodes for signals on the mounting substrate becomes difficult. FIG. 13 shows drawings for describing the problem, which consists of a plan view of the electrodes and a wiring pattern of a mounting substrate 900 to be connected to external connection bumps of an FCLSI 500 when, for example, the FCLSI 500 in FIG. 5 is mounted on the mounting substrate 900, and a schematic enlarged plan view of the portion corresponding to portion B of the FCLSI 500. If DBPs 523a and DBPs 523b of the FCLSI 500 are connected to, for example, the ground potential within the FCLSI 500, the wiring patterns connected respectively to corresponding electrodes 923a and electrodes 923b of the mounting substrate 900 are also connected to the ground potential. If it is assumed that the number of passable wirings between electrodes in the mount substrate 900 is two, for example, the number of wirings between one pitch of the electrodes that can be led out to the outside from the mounting region of the FCLSI is three, including the one for the outermost peripheral electrode. However, when the outermost peripheral electrode is a DBP connected to a fixed potential such as the ground potential, the number that can be l;ed out as the signal lines is only two. Accordingly, when the outermost peripheral electrode is a DBP connected to a fixed potential such as the ground potential, the number of signal lines that can be led out to the outside from the mounting region of the FCLSI 500 is reduced, so that the number of BPs for signal that can be available for input/output of signals among the bumps of the FCLSI 500 is reduced, which becomes an especially serious problem in a signal processing LSI or the like needed for a large number of signal terminals.

Furthermore, the problems related to the LSI or the semiconductor chip disclosed in the well-known example 1 or the well-known example 2 will become more serious because of the anticipation that the bump electrode space will be reduced further with a further advancement in miniaturization and increase in the pin number of the future LSIs.

BRIEF SUMMARY OF THE INVENTION

It is the object of the present invention to provide an LSI which is capable of coping with the increase in the number of pins without increase in the chip size, and suppress excessive accumulation of charge to DBPs, even if it is equipped with the DBPs for increasing the connection strength or the like at mounting, and is capable of preventing discharge to adjacent bump electrodes (pins) and breakdown of the semiconductor chip due to stored charge (electrostatic noise).

In order to achieve the above object, the semiconductor device according to the present invention is equipped at least a plurality of first bump electrodes arranged on a main surface, and each of said plurality of first bump receiving signals or power; a plurality of dummy bump electrodes arranged on said main surface, and each of said plurality of dummy bump electrically connected to associated one of said plurality of first bump electrodes.

Moreover, the semiconductor device according to the present invention is equipped at least a semiconductor substrate; an insulating layer formed above said semiconductor substrate; a plurality of first bump electrodes formed on said insulating layer, and each electrically connected to associated one of plurality elements formed in said semiconductor substrate; and a plurality of second bump electrodes formed on said insulating layer, and each electrically connected to associated one of said plurality of first bump electrodes.

BRIEF DESCRIPTION OF THE DRAWINGS

The above-mentioned and other objects, features and advantages of this invention will become more apparent by reference to the following detailed description of the invention taken in conjunction with the accompanying drawings, wherein:

FIGS. 1a-1b are drawings showing an embodiment of the semiconductor device according to the present invention, where part FIG. 1(a) is a schematic plan view of the face on the bump formation side of an FCLSI, and part FIG. 1(b) is an enlarged plan view of portion A in FIG. 1(a);

FIG. 3(a) and FIG. 3(b) are respectively a plan view and an example of the electrostatic protection circuit showing the configuration within the chip;

FIG. 4(a) is a simplified schematic partial plan view of an example of the mounting substrate with the LSI mounted, and FIG. 4(b) is an enlarged plan view of the wiring pattern of portion Q in (a);

FIG. 5(a) and FIG. 5(b) are respectively a schematic plan view showing the arrangement of the external connection bump electrodes, and an enlarged plan view showing also the connection with pads (PDs) on the chip of portion B in FIG. 5(a);

FIG. 7(a) is a plan view showing schematically the arrangement condition of the ball bumps on the side of face where ball bumps are formed, and FIG. 7(b) is a partially enlarged plan view including the connection wirings between the ball bumps in portion C in FIG. 7(a) and the electrodes on the chip;

FIGS. 9a-9c are drawings showing an example of a conventional BGA type LSI, where FIG. 9(a) is a plan view of the back side where ball bumps are formed, and FIG. 9(b) and FIG. 9(c) are sectional views along line P3–P3' in FIG. 9(a), which are examples when the electrodes of the semiconductor chip and the wiring conductors on the printed board are connected by a metal wire bonding and by a bump, respectively;

FIG. 10(a) and FIG. 10(b) are a plan view showing the arrangement of the bump electrodes and a sectional view of an important portion of the chip, respectively, and FIG. 10(c) and FIG. 10(d) are respectively schematic sectional views corresponding to the position along line P4–P4' in FIG. 10(a) shown in the mounting order of the chip;

DETAILED DESCRIPTION OF THE INVENTION

Referring to the accompanying drawings, the present invention will now be described.

Figure 2:
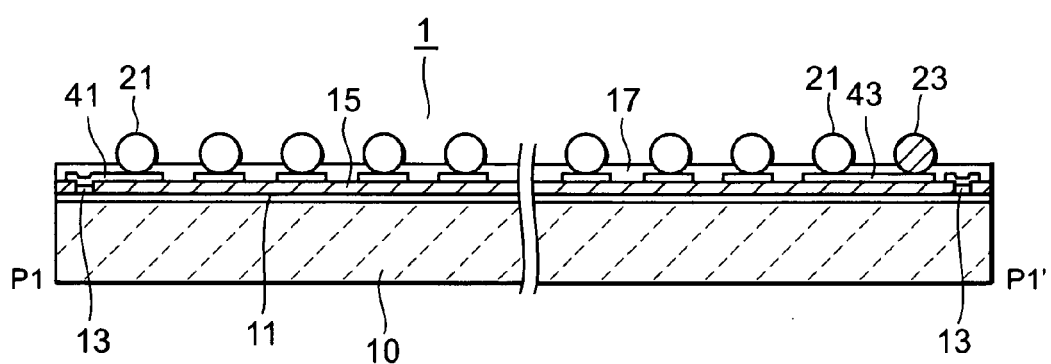
FIG. 2 is a sectional view showing schematically the cross-section along line P1–P1' in FIG. 1(a)

FIGS. 1a–1b are drawings showing an embodiment of the semiconductor device according to the present invention, where part (a) is a schematic plan view on the side of bump formation face of an FCLSI, and (b) is an enlarged plan view of portion A in part (a). FIG. 2 is a schematic sectional view along line P1–P1' in FIG. 1(a). Moreover, FIGS. 3a–bb shows schematic drawings of an example of the semiconductor chip forming the FCLSI, where part (a) and part (b) are respectively examples of a plan view showing the internal constitution of the chip and an electrostatic protection circuit.

Figure 3:
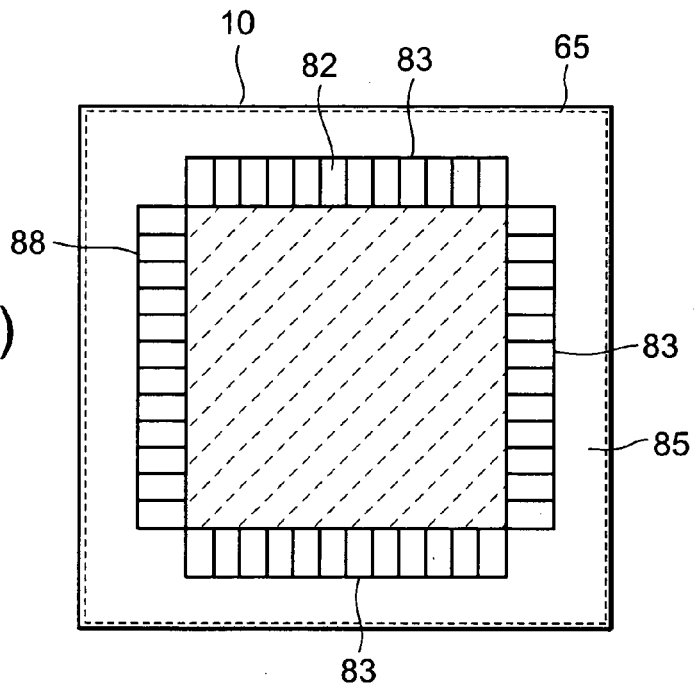
FIG. 3a-3b show drawings schematically illustrating an example of the semiconductor chip constituting the FCLSI, where
Figure 3:
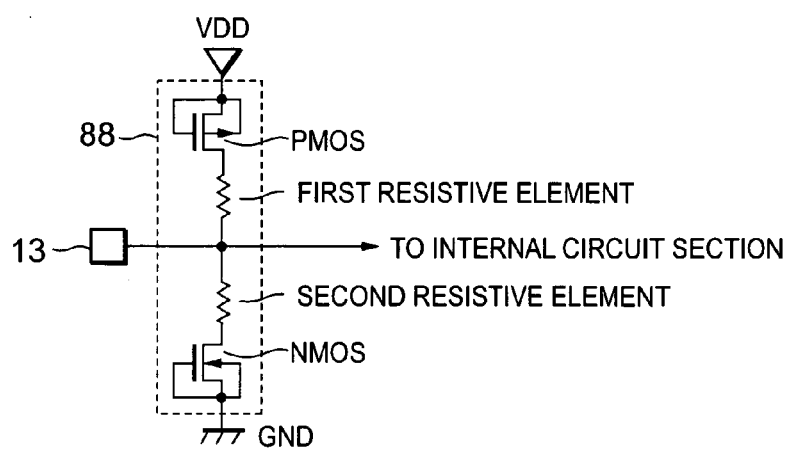

Referring to FIG. 1 to FIG. 3, an LSI 1 of this embodiment is equipped, on the side of element formation face of a semiconductor chip 10 where external connection pads (referred to as PDs hereinafter) 13 being chip electrodes are formed on desired elements, wirings (neither are shown) and a first insulating film 11 of silicon oxide film or the like, further with a rewiring layer insulating film 13 of polyimide or the like, external connection bumps (referred to as EBPs hereinafter) 21 being first bump electrodes corresponding to respective PDs 13 formed on the rewiring layer insulating film 15, DBPs 23 lacking corresponding PDs on the chip 10, wirings (referred to as EB rewirings hereinafter) 41 that connect the PDs 13 to the corresponding EBPs 21, and wirings (referred to as DB rewirings hereinafter) 43 that connect the DBPs 23 to prescribed EBPs 21 being second bump electrodes. The PDs are provided for supplying signals/GND/VDD to corresponding BPs at chip test. The plane shape of the chip 10 is rectangular or square, and the directions of its mutually orthogonal two sides are called X and Y directions. The chip 10 includes, for example, an internal circuit section 80, an I/O circuit section 83 formed by arranging a plurality of I/O buffer cells 82, and peripheral region 85, and a plurality of PDs 13 and an electrostatic protection circuit 88 interposed between the PD 13 and the internal circuit section 80 or the I/O circuit section 83, as needed, are arranged in the peripheral region 85. The electrostatic protection circuit 88 is not particularly limited, but it may be given a configuration in which between a high potential power supply (referred to as VDD hereinafter) and a low potential power supply (referred to as GND hereinafter), the source-drain path of a P-channel field effect transistor (referred to as PMOS hereinafter) whose gate is connected to the VDD, a first resistive element, a second resistive element, and the source-drain path of an N-channel field effect transistor (referred to as NMOS hereinafter) whose gate is connected to the GND, for example, are connected in series in this order, and the common connection point of the first resistive element and the second resistive element is connected to the PD 13 and a prescribed node, which is not shown, of the I/O circuit section 83. Moreover, the EBP 21 which is connected to the DBP 23 by the DB rewiring 43 and the PD 13 connected by the EB rewiring 41, are equipped with an electrostatic protection means such as the electrostatic protection circuit 88 between the internal circuit section 80 or the I/O circuit section 83. Since the constitution of the internal circuit section 80, the I/O buffer cells 82 and the I/O circuit section 83 is not directly related to the features of this invention, their specific constitution is not shown.

The external connection bump electrodes including the EBPs 21 and the DBPs 23 are arranged in nearly a matrix form, and the DBPs 23 form the first DBPs that are arranged in the chip edge sections in the outermost periphery. Each of the DBPs 23 is connected by the DB rewiring 43 to an EBP 21 being a second bump electrode arranged adjacent in the direction perpendicular to the edge on which the DBP 23 is arranged, namely, to the EBP 21 arranged on the center side of the chip 10 than the DBP 23. More specifically, a DBP 23a arranged in the edge section in the X direction is connected to an EBP 21a located adjacent to it in the Y direction, by a DB rewiring 43a. Moreover, the EBP 21a is connected to the corresponding PD 13a by the EB rewiring 41a. Besides, a DBP 23b also arranged in the edge section in the X direction is connected to an EBP 21b located adjacent to it in the Y direction, by a DB rewiring 43b. The EBP 21b is connected to a corresponding PD 13b by an EB rewiring 41b. However, in this case, the EB rewiring 41b is connected to N1 part at about the center of the DB rewiring 43b, and the section from the N1 part to the EBP 21b is made a common wiring for both of the EB rewiring 41b and the DB rewiring 43b. The position of the N1 part when using such a configuration may be set arbitrarily as long as it is on the DB rewiring, but it is preferable to be at a position closer to the EBP 21 than the central part of the DB rewiring.

Next, the manufacturing method of the rewiring portion of the LSI 1 will be described briefly. Since the formation of the elements and the wirings of the chip 10 may be done by adopting well-known methods, description about them will be omitted. Following the completion of the formation of the PDs 13, a surface protection film such as silicon nitride film, not shown, is deposited, a layer insulating film 15 for rewiring such as of polyimide resin is coated, and PDs 13 are opened. Then, after depositing a conductive film, for example, an aluminum (Al) film to a prescribed thickness (about 2 to 5 μm), bump seats for formation of prescribed external connection bump electrodes, the EB rewirings 41 for connecting respective bump seats to the corresponding PDs 13, and the DB rewirings 43 that connect the prescribed bump seats are formed by patterning the conductive film. Next, the bump seats are opened after coating a second insulating film 17 of polyimide or the like, and external connection bump electrodes are formed using solder or the like on a metal film of copper (Cu) or the like deposited via a barrier metal such as titanium (Ti) or chromium (Cr). Needless to say, an interposer substrate may be used for rewirings that connect the PDs 13 to the bump electrodes.

As described in the above, since in the LSI of this embodiment, the DBPs 23 arranged in the outer periphery are connected to the EBPs 21 arranged on the center side than the DBPs 23, of the chip 10, by the DB rewirings 43, even when electrostatic noise is applied to a DBP 23 and the potential of the DBP 23 is raised, as soon as it reaches a prescribed value, the electricity can be discharged by the EBP 21 and the electrostatic protection circuit connected to the PD 13 via the PD 13 connected to the EBP 21. Therefore, an excessive charge which gives rise to a gap discharge between the bumps will not be stored in the DBP 23, and breakdown of the LSI 1 due to electrostatic noise can be prevented. Moreover, by establishing the above-mentioned structure for the connection between the DBP and the EBP corresponding to the DBP, electrical connection between the PD and the EBP can be maintained even if the DBP arranged in the outer periphery, where it is susceptible to a mechanical stress as well as a thermal stress, is physically destroyed and eliminated.

Figure 4:
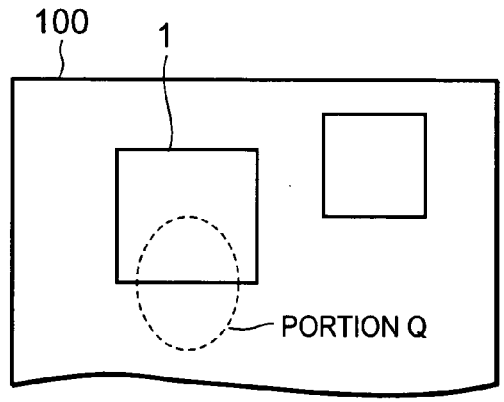
FIG. 4 is a drawing for describing the mounting substrate for mounting the LSI in FIG. 1(a), where
Figure 4:
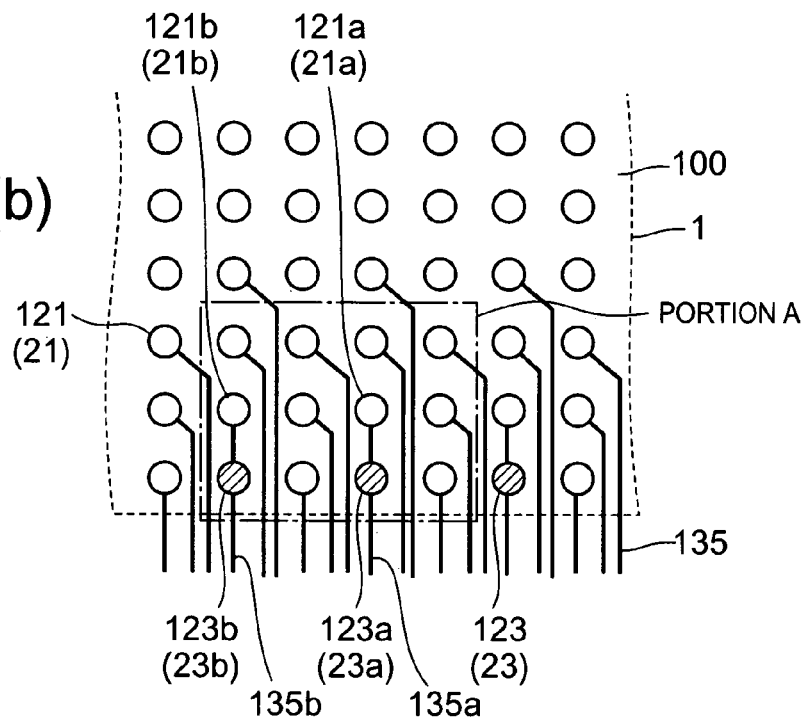
Figure 13:
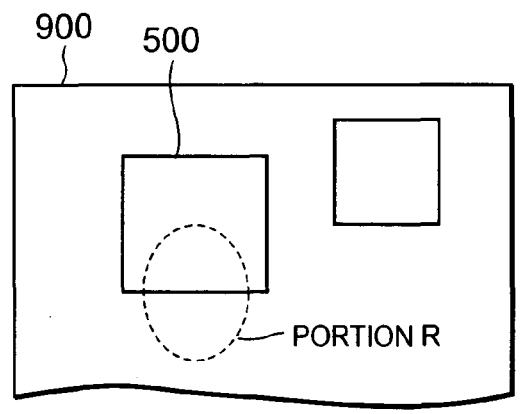
FIGS. 13(a) and (b) are a drawing for describing the problem that arises on the mounting substrate face when the DBPs are connected to a fixed potential in the conventional FCLSI.
Figure 13:
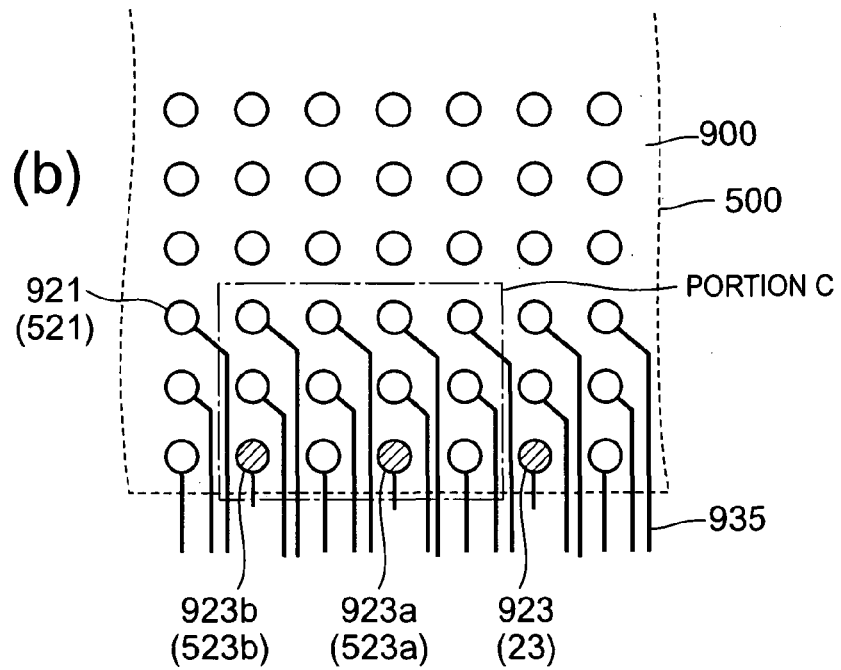

Moreover, when the LSI 1 is mounted on the mounting substrate, number of signal lines that can be led out from the mounting region of the LSI 1 to the outside equal to the number available when the DBPs are absent, can be secured. FIG. 4 is a drawing for describing the substrate for mounting the LSI 1, where (a) is a simplified schematic partial plan view of a mounting substrate 100 which shows an example of mounting of the LSI 1, and (b) is an enlarged plan view of the wiring pattern for portion Q in (a). As described in the above, since the DBPs 23 of the LSI 1 are connected to the EBPs 21 located adjacent on the inner periphery side by the DB rewirings 43, lead-out wirings 135 of substrate electrodes 121 of a mounting substrate 100 that are connected to the EBPs 21 can be led out passing substrate electrodes 123 as shown in FIG. 4, it is possible to secure the number of signal lines that can be led out to the outside from the mounting region of the LSI 1 of the mounting substrate 100 in the same number as in the case where the DBPs 23 are absent. More specifically, for example, a lead-out wiring 135a to the outside of the LSI mounting region from a substrate electrode 121a of the mounting substrate 100 which connects at mounting an EBP 21a connected to a DBP 23a by a DB rewiring 43a of the LSI 1 can be led out by passing above a substrate electrode 123a, and a lead-out wiring 135b to the outside of the LSI mounting region from the substrate electrode 121b of the mounting substrate 100 which connects at mounting an EBP 21b connected to a DBP 23b by a DB rewiring 43b can be led out by passing above a substrate electrode 123b. Accordingly, similar to the case of the mounting substrate 900 in FIG. 13, if the number of wirings that can be passed between electrodes is assumed to be two, the number of signal lines between one pitch of the electrodes that can be led out to the outside from the mounting region of the LSI 1 of three can be secured regardless of presence or absence of the DBPs 23.

Figure 5:
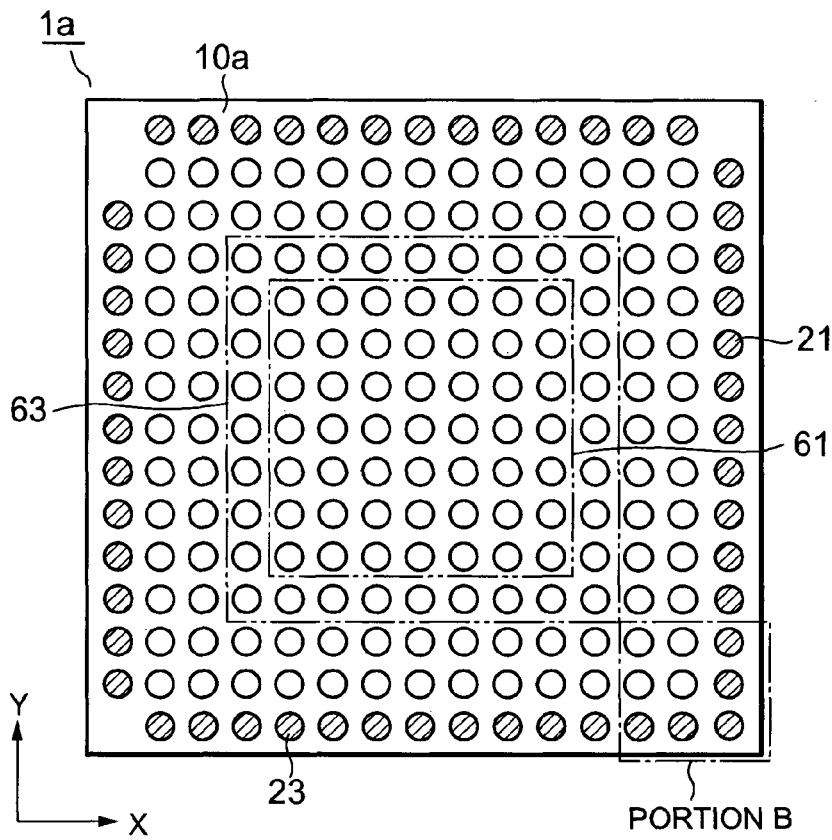
FIGS. 5a-5b are drawings for describing the case when dummy bumps (DBPs) are concentrated in a corner part of the LSI, where
Figure 5:
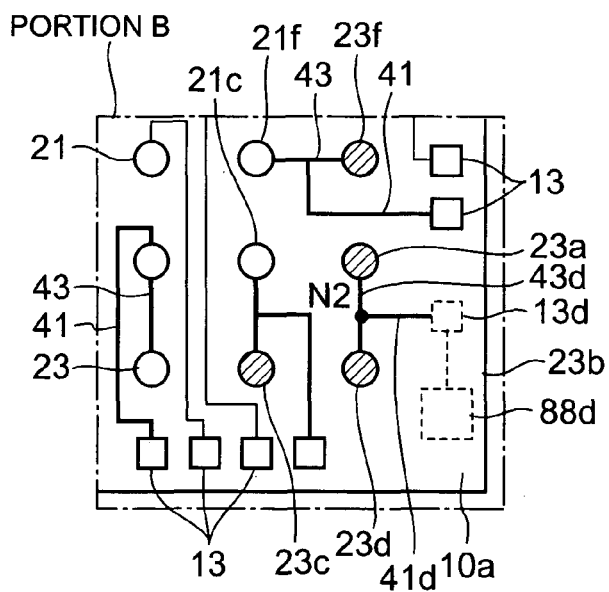
Figure 6:
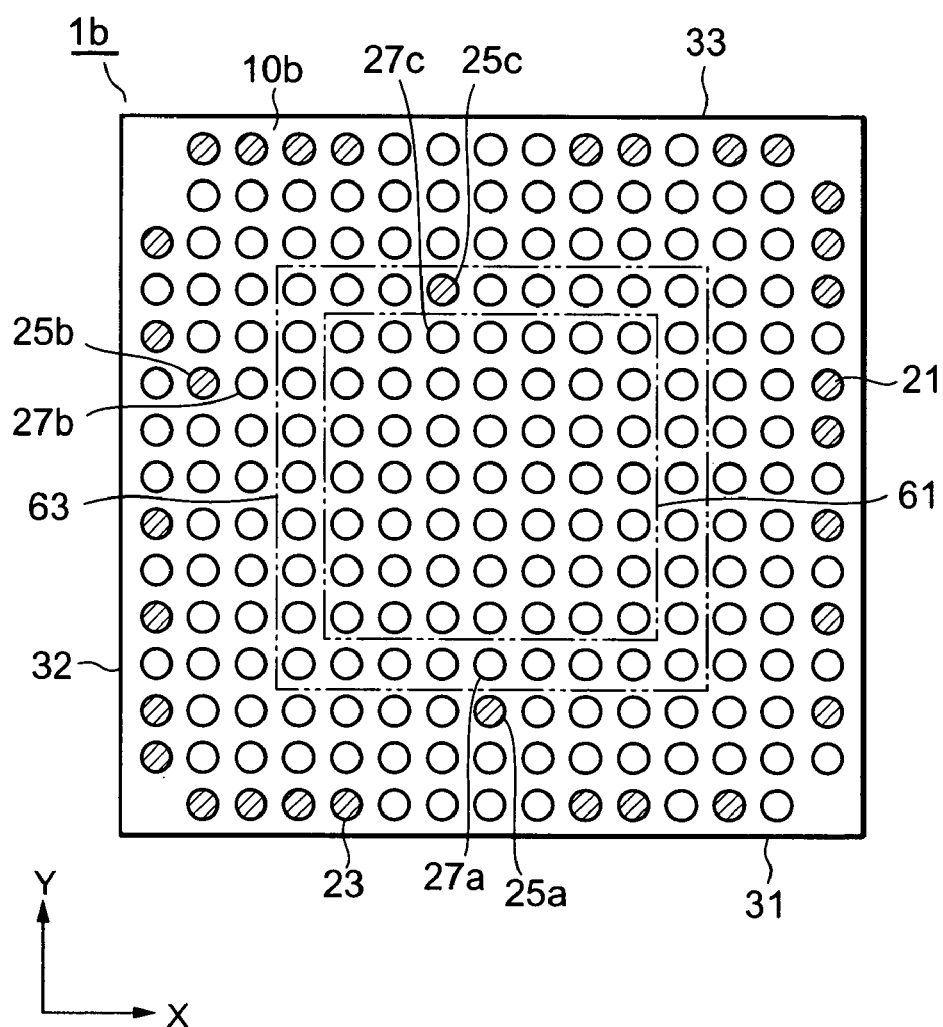
FIG. 6 is a drawing for describing the processing method when free bump electrodes that are not connected to the elements in the chip are produced in the inner periphery.
Figure 7:
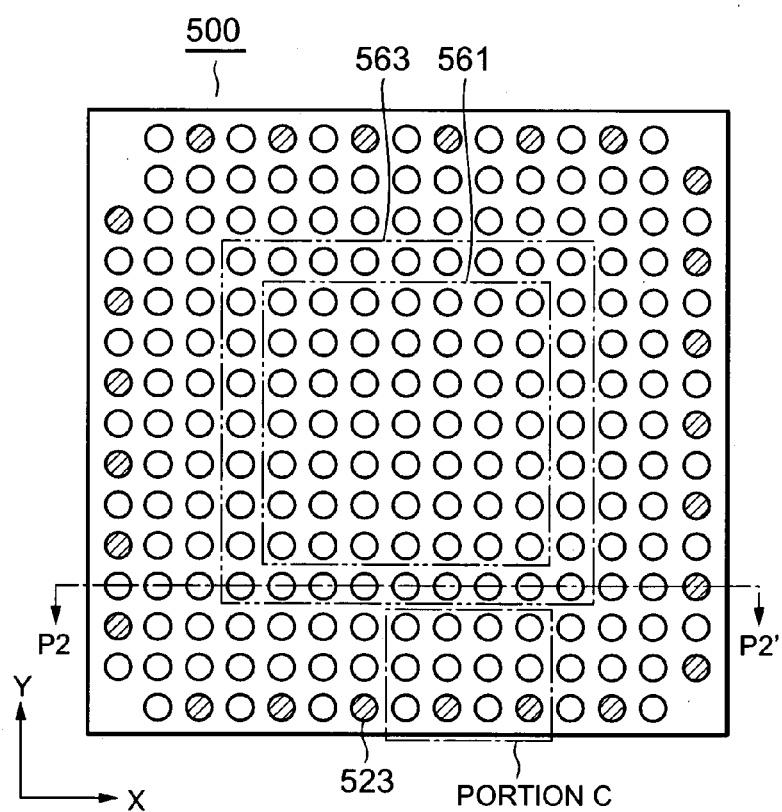
FIGS. 7a-7b are drawings showing an example of a conventional FCLSI, where
Figure 7:
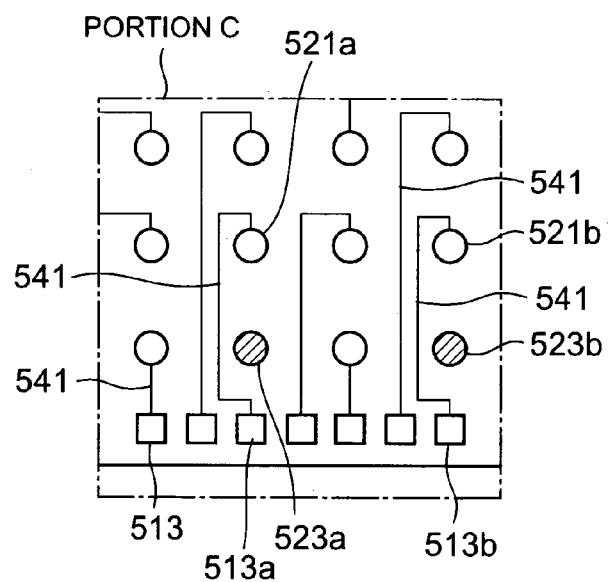
Figure 8:
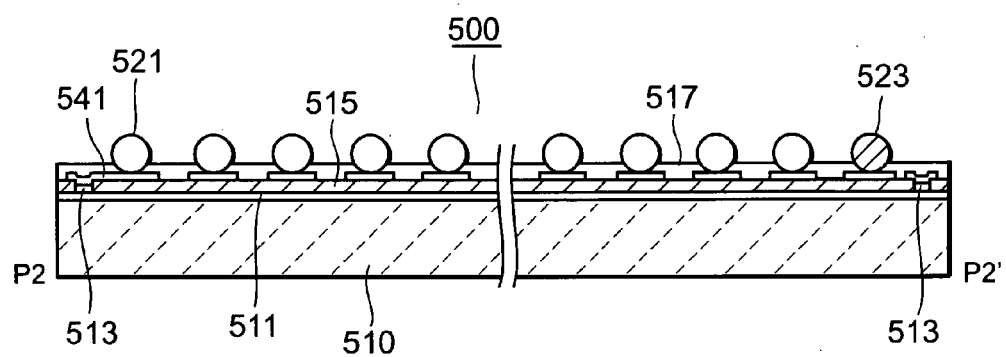
FIG. 8 is a sectional view along line P2–P2' in FIG. 7(a)
Figure 10:
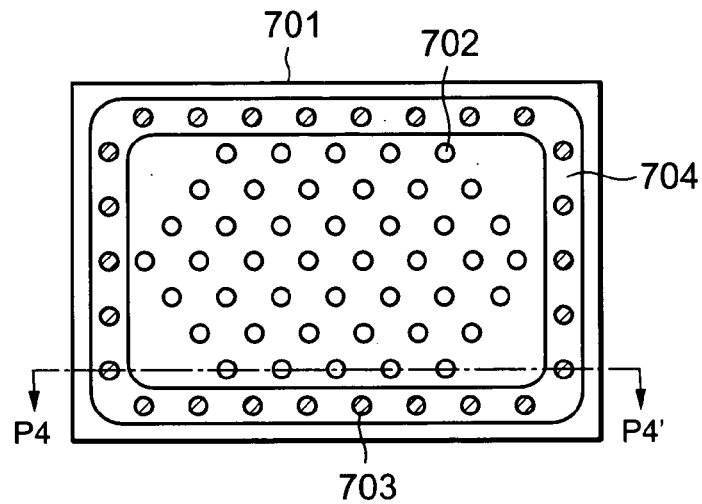
FIGS. 10a-10d are drawings for describing the semiconductor chip disclosed in Japanese Patent Applications Laid Open, No. Hei 1-238148, where
Figure 10:
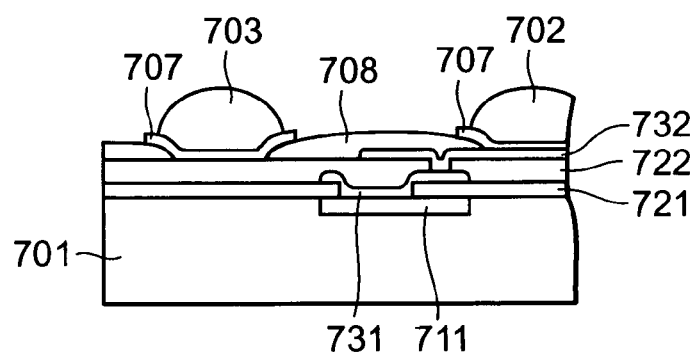
Figure 10:
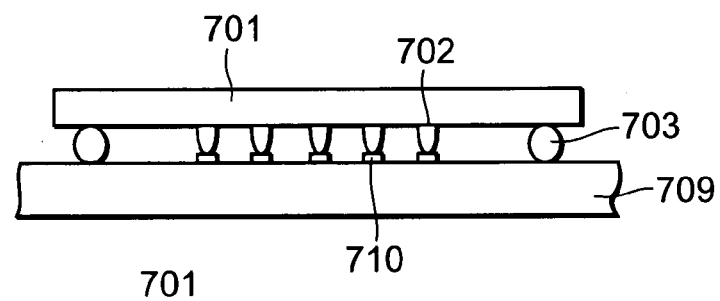
Figure 10:
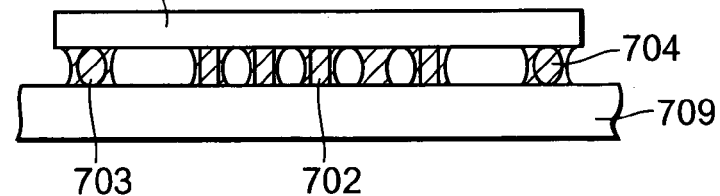
Figure 11:
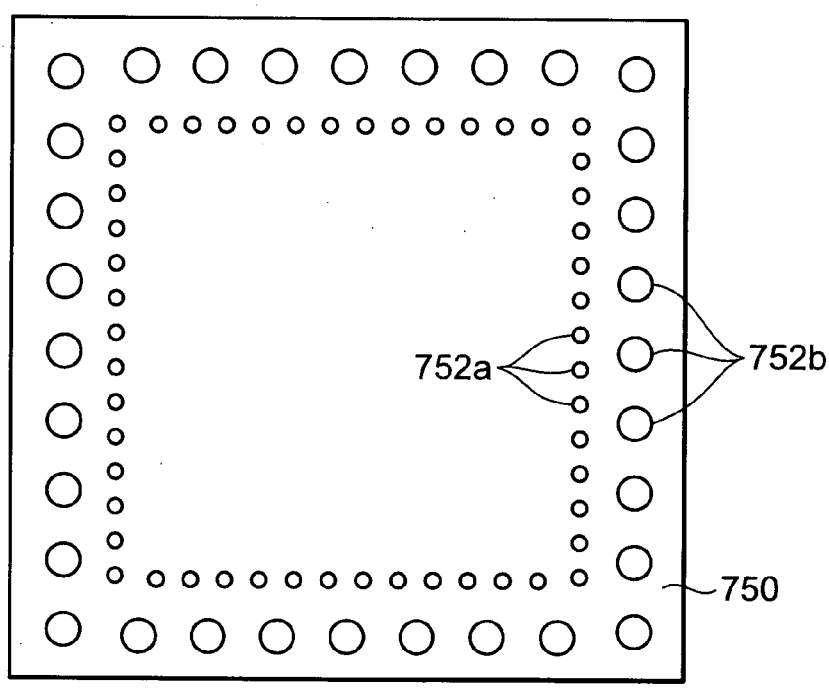
FIG. 11 is a plan view showing an example of configuration of the bump electrodes of the FCLSI disclosed in Japanese Patent Applications Laid Open, No. Hei 10-12620.
Figure 12:
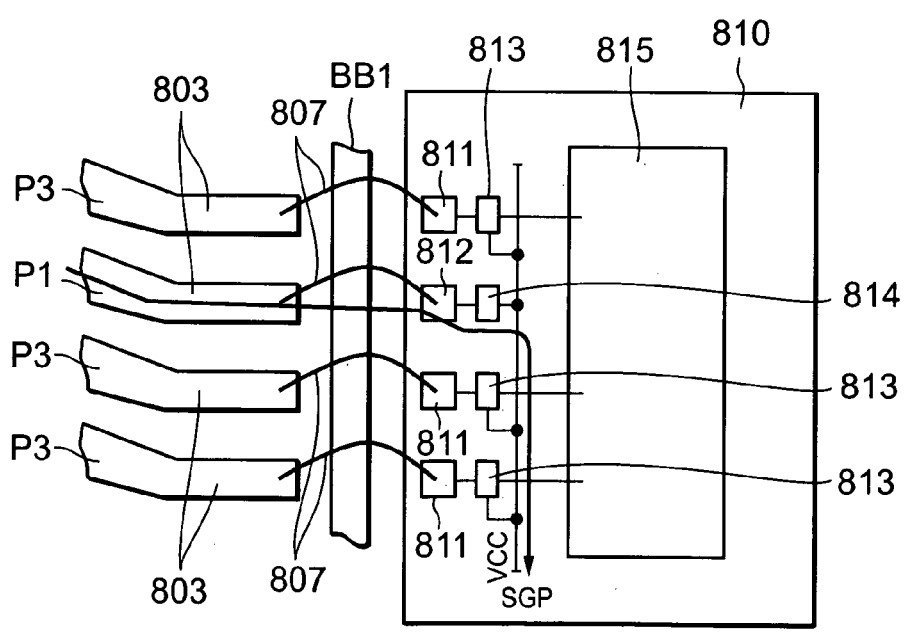
FIG. 12 is an explanatory drawing of the NC pins and the electrostatic discharge protection circuit disclosed in Japanese Patent Applications Laid Open, No. Hei 11-163247.

Moreover, when all of the bump electrodes in the outermost periphery are set DBPs, for example, as in the well-known examples shown in FIG. 10 and FIG. 11, there arises a case in which a plurality of adjacent bumps in the inner periphery of the DBPs overlap with one EBP in the corner part. FIG. 5 is a drawing which describes the case of concentration of the DBPs in a corner of the LSI, where (a) is a schematic plan view showing the arrangement of external connection bump electrodes, and (b) is an enlarged plan view showing also the connection with the PDs 13 on the chip in portion B in (a). In an LSI 1a, an EBP 21c in the portion B is playing the role of being a common adjacent bump on the inner peripheral side for a plurality of the DBPs, namely, DBP 23c, DBP 23d and DBP 23e. In such a case, it may be arranged to connect the EBP 21c and the EBP 21f only to the DBP 23c and the DBP 23f, respectively, and as for the DBP 23d and the DBP 23e for which an EBP 21 that can be connected does not exist in the neighborhood, an electrostatic protection circuit 88d and a PD 13d which is a dummy chip electrode connected only to the electrostatic protection circuit 88d may be provided. Then, for example, set the DBP 23d as a third bump electrode and may connect it to the PD 13d with an EB rewiring 41d, and connect the DBP 23d and the DBP 23e with a DB rewiring 43d. In this case, it is preferable to connect the EB rewiring 41d that is connected to the PD 13d to an N2 part nearly at the center of the DB rewiring 43d that connects the DBP 23d and the DBP 23e. With this arrangement, even if either one of the DBP 23d or the DBP 23e is broken down physically and is eliminated due to a mechanical stress, a thermal stress, or the like, it is possible to maintain the electrical connection for the other member. In this case, entirely the same configuration can be obtained if the DBP 23e is chosen as the third bump electrode It is to be noted that the present invention is not limited to the embodiments described in the above, and various modifications are possible. For example, in the FCLSIs, CSP type LSIs, BGA type LSIs, or the like, although not mentioned in the above description, it is general when the external connection bump electrodes are arranged in matrix form as in FIG. 1(a) and FIG. 5(a), to arrange bump electrodes for power supplies in the central part, for example, in the region surrounded by a first boundary 61, and arrange the bump electrodes for signal input and output that are required for connection with other devices, on the outside of the first boundary 61. (Note, however, that there is a case, as in LSI 1b in FIG. 6, in which a region with no bump electrode is provided at the central region surrounded by the first boundary 61.) With this arrangement, the wiring formation on the mounting substrate for connection with another device is facilitated. Accordingly, when a free bump electrode that is not connected to an element on the chip, substantially in the same situation as in the DBP, corresponding to the position of the free bump electrode, for example, it is connected to an adjacent bump electrode within the region surrounded by the first boundary 61 when it is in the region between the first boundary 61 and a second boundary 63, and it may be connected to an EBP adjacent in the direction perpendicular to the side (edge) of the outer shape of the LSI located at the shortest distance from the free bump electrode when it is in the region outside the secondary boundary 63. More specifically, for example, in the case of the LSI 1b in FIG. 6, for the free bump electrode 25a, it is connected to an EBP 27a adjacent in the direction perpendicular to the side 31 at the shortest distance, namely, in the Y direction, for a free bump electrode 25b, it is connected to an EBP 27b adjacent in the direction perpendicular to the side 32 at the shortest distance, namely, in the X direction, and for a free bump electrode 25c, since it is situated in the region between the first boundary 61 and the second boundary 63, it is connected to an EBP 27c adjacent in the first boundary 61.

Moreover, in the above embodiments, description has been given presupposing the case of forming an FCLSI by diverting a chip used in an existing assembly form of another kind adopted frequently in the manufacture of the FCLSI, and more specifically, a chip used in a method employing bonding connection by a metal wire. Accordingly, it has been assumed to connect each EBP and internal element by an EB rewiring using a PD connected to the internal element. However, when there is no need for forming PDs using a chip dedicated to an FCLSI, it is obvious that a prescribed internal element (input/output buffer cell, an electrostatic protection circuit, or the like) and the corresponding each EBP by direct connection using an EB rewiring is possible.

Furthermore, although the above embodiments have been described in conjunction with the FCLSI as an example, needless to say the present invention is applicable as is to LSIs that use bump electrodes as external connection terminals such as the CSP type LSI and BGA type LSI.

As described in the above, the LSI of the invention that uses the bump electrodes as external connection terminals can cope with multiple pin trend without increase in the chip size, and in addition, even when the chip is equipped with the DBPs for increasing the connection strength at mounting, it is possible to suppress storage of an excessive charge to the DBPs and prevent discharge to the adjacent bump electrodes (pins), and prevent breakdown of the semiconductor chip due to stored charge (electrostatic noise). Moreover, even if a large umber of DBPs are arranged in the outermost periphery, the number of lead-out wirings that can be led out from the inner periphery side of the mounting substrate can be maintained at the same number as in the case where the DBPs are absent.

Although the invention has been described with reference to specific embodiments, this description is not meant to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. A semiconductor device comprising:
   a plurality of first bump electrodes arranged on a main surface, and each of said plurality of first bump electrodes receiving signals or power;
   a plurality of dummy bump electrodes arranged on said main surface, and each of said plurality of dummy bump electrodes electrically connected to an associated one of said plurality of first bump electrodes wherein said plurality of dummy bump electrodes and said plurality of first bump electrodes being arranged alternately along to circumference of bump group.

2. The semiconductor device as claimed in claim 1 further comprising:
   a plurality of protection circuits electrically coupled to said plurality of first bump electrodes.

3. The semiconductor device as claimed in claim 1, further comprising: a plurality of test electrodes electrically connected to said first bump electrodes.

4. The semiconductor device as claimed in claim 3, wherein said plurality of test electrodes being arranged along four edges of said semiconductor device.

5. The semiconductor device as claimed in claim 1, wherein said plurality of dummy bump electrodes being higher than a plurality of chip electrodes.

6. The semiconductor device as claimed in claim 1, wherein said plurality of dummy bump electrodes being arranged closer than said plurality of first bump electrodes.

7. The semiconductor device as claimed in claim 1, wherein said plurality of dummy bump electrodes being arranged between said plurality of first bump electrodes and a plurality of chip electrodes.

8. The semiconductor device as claimed in claim 1, wherein said plurality of dummy bump electrodes being provided for relaxation of stress at mounting said semiconductor device.

9. A semiconductor device comprising:
   a pad formed above a semiconductor chip;
   an external bump electrode formed above said semiconductor chip corresponding to said pad;
   a dummy bump electrode formed above said semiconductor chip;
   a first wiring connected between said external bump electrode and said dummy bump electrode; and
   a second wiring connected between a center of said first wiring or a portion near to said external bump electrode from said center of said first wiring and said pad.

10. The semiconductor device as claimed in claim 9, wherein said dummy bump electrode is formed between said external bump electrode and said pad.

11. The semiconductor device as claimed in claim 10, wherein said dummy bump electrode is arranged in a direction along a side of said semiconductor chip.

12. The semiconductor device as claimed in claim 10, wherein said external bump electrode is arranged internally from a side of said semiconductor chip relative to said dummy bump electrode.

13. The semiconductor device as claimed in claim 9, wherein said external bump electrode receives a signal through said pad.

14. A semiconductor device comprising:
   a semiconductor chip;
   a first pad formed above said semiconductor chip;
   a second pad formed above said semiconductor chip;
   a first external bump electrode above said semiconductor, and connected to said first pad;
   a second external bump electrode above said semiconductor, and connected to said second pad;
   a first dummy bump electrode above said semiconductor, and connected to said first external bump electrode; and
   a second dummy bump electrode above said semiconductor, and connected to said second external bump electrode,
   wherein said first dummy bump electrode is formed between said first pad and said first external bump electrode, and said second dummy bump electrode is formed between said second pad and said second external bump electrode.

* * * * *